(12) United States Patent
Kolaric

(10) Patent No.: US 7,426,705 B1
(45) Date of Patent: Sep. 16, 2008

(54) COMBINED HARDWARE/SOFTWARE ASSERTION CHECKING

(75) Inventor: Herbert K. Kolaric, Watertown, MA (US)

(73) Assignee: DAFCA, Inc., Framingham, MA (US)

( * ) Notice: Subject to any disclaimer, the term of this patent is extended or adjusted under 35 U.S.C. 154(b) by 105 days.

(21) Appl. No.: 11/120,041

(22) Filed: May 2, 2005

(51) Int. Cl.
*G06F 17/50* (2006.01)
*G06F 9/45* (2006.01)
*H03K 17/693* (2006.01)

(52) U.S. Cl. .................. 716/4; 716/5; 716/16
(58) Field of Classification Search ............. 716/4–5, 716/6, 16
See application file for complete search history.

(56) References Cited

U.S. PATENT DOCUMENTS

2006/0031807 A1* 2/2006 Abramovici ............... 716/17

* cited by examiner

*Primary Examiner*—Jack Chiang
*Assistant Examiner*—Suresh Memula
(74) *Attorney, Agent, or Firm*—Henry Brendzel

(57) ABSTRACT

Assertion checking is achieved by modifying a given set of assertions to include subsuming assertions that cover one or more of given assertions and also require less logic to implement, by implementing at least the subsuming assertions in functionally reconfigurable circuitry within an integrated circuit, and by checking with an auxiliary tester assertions that each of the firing subsuming assertion replaced.

14 Claims, 2 Drawing Sheets

COMBINED HARDWARE/SOFTWARE ASSERTION CHECKING

RELATED APPLICATION

This application is related to U.S. patent application Ser. No. 10/425,101, filed Apr. 28, 2003, to U.S. patent application Ser. No. 10/956,854, filed Oct. 1, 2004, and to U.S. patent application Ser. No. 11/051,774 filed Feb. 4, 2005, which are hereby incorporated by reference.

BACKGROUND

This invention relates to integrated circuits and, more particularly, to functional testing and debugging of integrated circuit designs.

The Ser. No. 10/956,854 patent application discloses a beneficial design approach for System on a Chip (SoC) devices, where each core is encompassed with a wrapper that includes a functionally reconfigurable module (FRM). The advance in the art disclosed in the Ser. No. 10/956,854 patent application incorporates configurable circuits within the FRM that perform assertion checking.

In assertion checking, a collection of conditions is identified that are expected to hold true during the operation of a properly working SoC, and the SoC is exercised to determine that, in fact, this is true. To perform assertion checking, the tested SoC receives various stimuli (test inputs, or normal operation type inputs), and the resulting SoC states are checked against the collection of assertions. Typically assertion checking is done in simulation, because it is not practical to implement many assertion in fixed hardware. The invention described in the Ser. No. 10/956,854 patent application removed this restriction by allowing assertions to be efficiently implemented in reconfigurable hardware. In hardware, assertion checking can be of two types: "at-speed" assertion checking, or "single-step" assertion checking. In "at-speed" assertion checking, only the directly observable signals of a core are available for the assertion checking, so assertions that require knowledge of the states of flip-flops that are internal to the SoC cannot be checked. Moreover, the assertions need to be checked with circuitry that works at the clock's speed. That is, the checking of all of the assertions must be completed within one operational clock period. In "single-step" assertion checking, the internal flip-flops of the SoC are interconnected to form a scan chain (the circuitry for forming the scan chain having been included in the SoC design in accord with conventional design practices), the data of the formed scan chain is scanned out, and the information thus obtained is analyzed to determine whether any of the assertions fire. The scanned-out data is re-inserted into the SoC in order to return the SoC to the state in which it was prior to scanning out the scan chain data.

The Ser. No. 10/956,854 patent application also discloses the "Continuous Single Step" (CSS) mode, which makes possible automatic checking of assertions after every functional clock. That is, the SoC under test is activated in its normal mode (mode A) for a single period of the operational clock, and then moved to its assertion checking mode (mode B). During the assertion checking mode the scan chain is formed, the required bits are extracted from scan chains (and re-injected, to return the circuit to its operational state), and tested against the set of assertions. If none of the assertions fires, the SoC is again activated in its normal operation for one period of the operational clock, and again moves to its assertion-checking mode.

Clearly, at-speed assertion checking is faster than CSS assertion checking, but also clearly, at-speed assertion checking cannot check assertions that require knowledge of values of internal flip-flops that are not directly observable. Also, it may happen that some assertions may be too large to be implemented in the reconfigurable hardware available on chip (i.e., require more hardware than can be configured in the FRM).

SUMMARY

An advance in the art is realized by allowing the decomposition of some (e.g., large) assertions into parts that are implemented in on-chip hardware and parts that are implemented in software running in an embedded processor, or in an off-chip processor.

In one illustrative embodiment, the collection of assertions against which the SoC needs be tested is substituted with a Replacing collection (R collection). The R collection contains a number of the original assertions and a number of subsuming assertions (S assertions), where each S assertion subsumes and replaces one or more of the assertions in the original collection of assertions. The principle of the selection of the S assertion is that firing of an S assertion is a necessary, but not sufficient condition, for firing of the assertions replaced by S. Thus, the number of assertions in the R collection is equal to or less than the number of assertions in the original collection but, still, it is expected that in most situations the R-collection must be divided into R-sets, where each set is sufficiently small to be accommodated by the SoC's FRM, and the SoC must be tested one set at a time. Of course, it is quite possible that an original set of assertions will consist of a single assertion, and the R collection will similarly consist of one subsuming assertion. It should be noted that the subsuming assertion is not necessarily a sub-expression derived from the sole original assertion, but may also include observable variables in the circuit with which the original assertion is dependent.

There is no requirement that either the S assertions or the original assertions that are included in the R collection use only the signals that are available with at-speed operation, but constraining those assertions to only those that employ the signals that are observable with at-speed operation (i.e., inputs and outputs of the SoC, and wrapped signals within the SoC) is certainly advantageous, because it permits testing the SoC with at-speed operation, until some S assertion fires. A firing S assertion indicates that one or more of the assertions covered (and replaced) by the subsuming assertion might have fired. Therefore, in response to a firing signal that indicates an S assertion firing, the SoC exits the at-speed mode of operation, and a tester checks the original assertions that the firing assertion replaced. The data to be checked, which may include values of flip-flops from scan chains, is delivered to the tester. The required data from scan chains may be obtained using bit extractors implemented in FRMs, as described in the aforementioned Ser. No. 11/051,774 application. The tester can be a hardware or software tester, and it can be off-chip, or part of the SoC. Illustratively, the tester can be embodied in any of the processors within the SoC, because when the tester checks assertions, the SoC is no longer in its normal mode of operation and the processor is available to do these checks.

Of course, whether operating in a "single step" mode or in CSS mode, the tester can reconfigure the assertion-checking circuits, or trigger-generating circuits, within the FRM prior to applying a subsequent operational clock.

DETAILED DESCRIPTION

As described in the aforementioned Ser. No. 10/425,101 application, an FRM can be realized with field-programmable logic arrays (FPLAs) in a conventional manner, and the variety of digital circuits that can be created within an FPLA is essentially limitless, except from the standpoint of quantity of circuits that can be configured. That is, the integrated circuit's silicon area, i.e., the real estate, which is occupied by the FRM (included within the wrappers of one or more cores included in the SoC) is constrained to some portion of the overall silicon area of the SoC and, therefore, the amount of logic that can be configured within the FRM is also limited. Moreover, the real estate occupied by the FRM is in some sense an expense that ought to be driven down because whatever real estate is devoted to the FRM reduces the real estate that is available for the functional logic.

Often, the collection of assertions against which an SoC needs to be tested is such that the FRM real estate that is required to check all of the assertions concurrently is greater than the SoC offers. In such circumstances, assertion checking of SoCs involves subdividing the collection of assertions into sets, where each set contains a small enough number of assertions to be configured within the SoC's FRM. It should be noted that it is also possible that the SoC needs to be checked against an assertion that is so complex that even this single assertion cannot be tested within the FRM.

In accord with one of the principles disclosed herein, checking of large assertions is made possible, and the overall speed of assertion testing of an SoC is improved, by employing an auxiliary tester, which implements some of the logic necessary for checking some assertions, which, in turn, allows subdividing the collection of assertions that need to be checked into fewer sets. An additional advantage accrues by replacing the original collection of assertions with an R-collection consisting of assertions that require only signals that are observable with at-speed operation.

Figure 1:
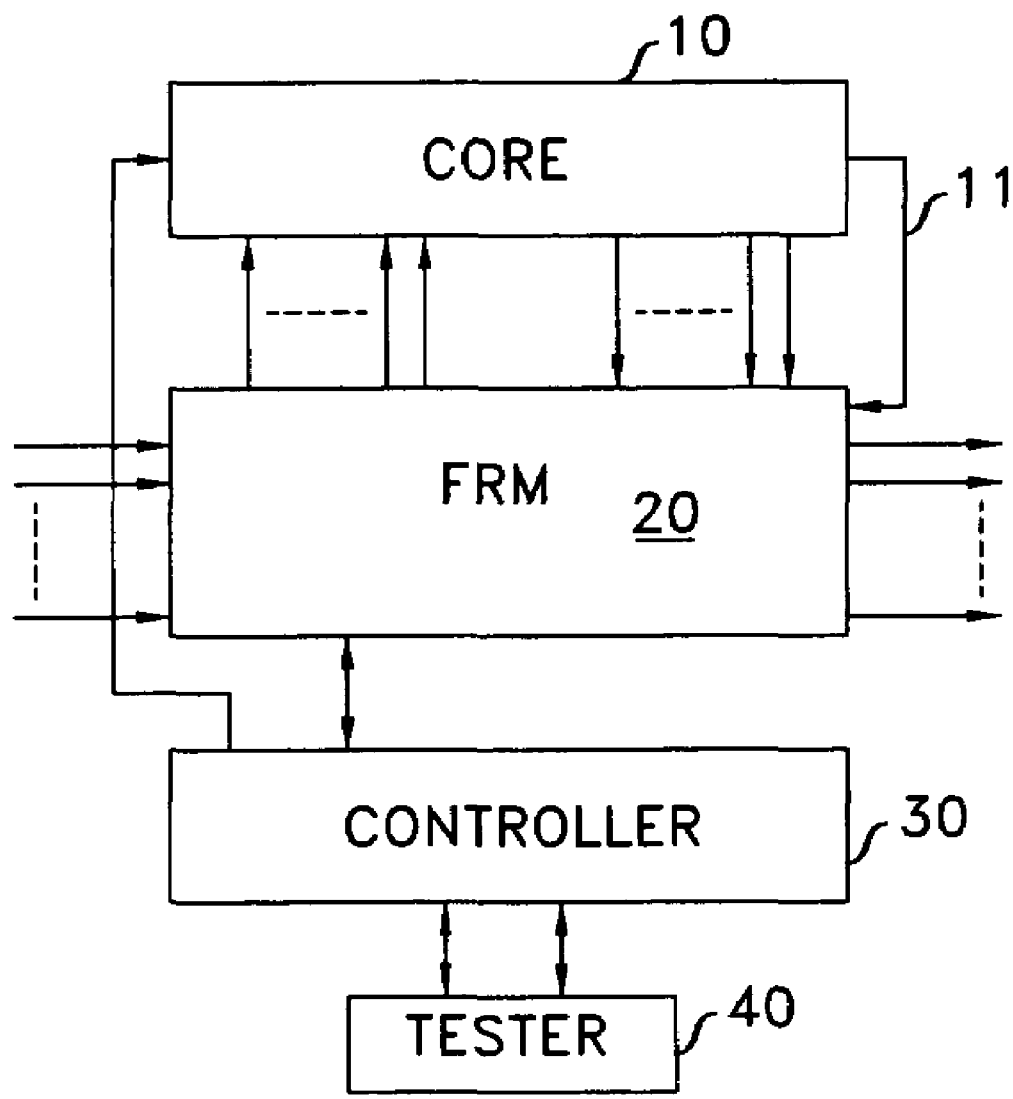
FIG. 1 shows an assertion checking arrangement that includes an auxiliary tester.

FIG. 1 presents one illustrative embodiment of the principles disclosed herein. It depicts an SoC that includes a core 10, FRM 20 that effectively is a wrapper of core 10, and controller 30 that manages core 10 and FRM 20. Additionally, FIG. 1 includes tester 40 that interacts with controller 30 of the SoC via a data path and a control path.

The auxiliary tester, 40, can be software or hardware controlled, and when it is software controlled, it can be off-chip, or embedded in the SoC. When embedded in the SoC, the tester comprises one of the processors of the SoC and associated memory. A processor of the SoC can be used for the auxiliary tester function because once an S assertion fires and it is necessary to output the scan chain data of the SoC, the processors of the SoC are not in operational mode anyway.

Core 10 includes a scan chain output 11 that is connected to controller 30 via FRM 20. The scan chain output is able to provide all the values needed to check the assertions implemented in the tester. These values may include states of flip flops within the SoC, and values of other observable signals. Collectively, the output data of the scan chain is referred to herein as the state of the SoC. It is, of course, possible to have a number of scan chains; for example, one scan chain that contains the states of the internal flip-flops of the SoC and another scan chain for serially outputting the observable signals. For illustrative purposes, only a single scan chain is depicted.

Each assertion in the collection of assertions corresponds to a combinatorial logic expression. For example, the expression $$a_1 = a_2(a_3 a_4 + a_5 \bar{a}_6 a_7) + a_8 \bar{a}_9 (a_2 + a_5), \tag{1}$$

where each of the elements in the expression is a variable of the state of the SoC, might be an assertion against which the SoC needs to be tested. Obviously, more complex expressions require more logic circuits to implement and, therefore, when the collection of assertions contains many expressions, and at least some of them are very complex, it is necessary to judiciously subdivide the collection into sets such that the logic necessary for implementing the assertions in the set is not more than what can be configured in the FRM of the tested SoC. The process of dividing, which forms no part of this invention, can be done in any number of ways, with "trial and error" being one of them. The important point to note is that the amount of logic necessary to realize the assertions of a set must not exceed that which the SoC's FRM can configure.

Assertion checking may be done by combinational or sequential logic. For example, an assertion may check for a specific sequence of events that should happen in a correctly functioning circuit, such as "a REQUEST signal must be followed by an ACKNOWLEDGE signal in at most 3 clock cycles". Such an assertion requires a sequential circuit whose state transitions are initiated by the same functional clock that operates the SoC logic. The inputs of the combinational logic that checks the assertion also include state variables of the sequential circuit, in addition to signals of the SoC.

Focusing on the equation (1) assertion, a number of observations can be made. First, the right-hand-side of equation (1) requires (in terms of 2-input gates)

1 inverter, 4 AND gates, and 1 OR gate to develop the $a_2(a_3 a_4 + a_5 \bar{a}_6 a_7)$ term, 1 inverter, 2 AND gates, and 1 OR gate to develop the $a_8 \bar{a}_9 (a_2 + a_5)$ term, and 1 OR gate to develop the $a_2(a_3 a_4 + a_5 \bar{a}_6 a_7) + a_8 \bar{a}_9 (a_2 + a_5)$.

This is a total of 6 AND gates, 3 OR gates and 2 inverters.

Second, if any of the variables corresponds to an internal flip-flop of the SoC, this expression can be evaluated only by a scan-out operation performed after the functional clock has been stopped.

Third, if the equation (1) expression is replaced with, for example, with the S assertion:

$$a_1 = a_2 + a_8 \bar{a}_9 \tag{2}$$

and the variables of equation (2) are all available with at-speed operation, two benefits accrue: (a) this assertion can be checked with at-speed operations; and (b) the amount of FRM real estate to implement equation (2) is significantly smaller than the amount of FRM real estate required to implement equation (1). Consequently more assertions might be possible to be included in the set that includes the equation (2) S assertion. Also, if all of the assertions in the set are assertions that can be checked with at-speed operation, that would make the checking of that set potentially very fast.

Of course, when equation (2) fires it is not certain that the condition of equation (1) occurred. Viewed conversely and more generally, if an S assertion fires, it means that the actual one or more assertions that the S assertion replaces might or might not have fired. Therefore, the firing of an S assertion is merely an event that dictates more comprehensive additional testing.

It may be noted that there is nothing particularly special about the S assertion of equation (2). As suggested above, it is advantageous to constrain an S assertion to use only the variables that are available with at-speed operation and, therefore, if for example $a_2$ is not available with at-speed operation, but $a_3$ $a_5$ and $a_9$ are available, then the following S assertion might be chosen:', $$a_1 = (a_3 + a_5) + a_8 \bar{a}_9, \quad (3)$$

which requires 1 inverter, 1 AND gate and 2 OR gates.

It may be further noted that subsuming assertions that contain fewer terms are broader and require less hardware to realize than assertions that contain more terms. However, such assertions are likely to unnecessarily fire more often than the more focused assertions that contain a greater number of terms. In other words, there is a tradeoff between increased false firings and reduced FRM real estate requirements.

It is possible that an S assertion was created solely to eliminate variables that are not available with at-speed operation, and it is also possible that the S assertion was created simply to reduce the amount of logic that would need to be realized within the FRM. Regardless of the reason, in accord with the principles disclosed herein once an S assertion fires, the SoC testing enters an auxiliary test phase, and that involves obtaining additional necessary data, providing it to tester 40, and testing therein for the assertion, or assertions, of the original collection of assertions that the S assertion replaced. Thereafter, the process continues responsively, based on whether tester 40 indicates that an assertion of the original collection fired, or not. Typically, the process of obtaining the additional necessary data involves outputting data from the SoC's scan chain.

It may be noted that the FRM hardware that implements an assertion and outputs an indication whenever an assertion fires must identify the assertion that has fired. This applies to assertions that are not S assertions and which do not need to engage tester 40, and even more importantly to S assertions that need to transmit the identity of the firing S assertion to tester 40.

Figure 2:
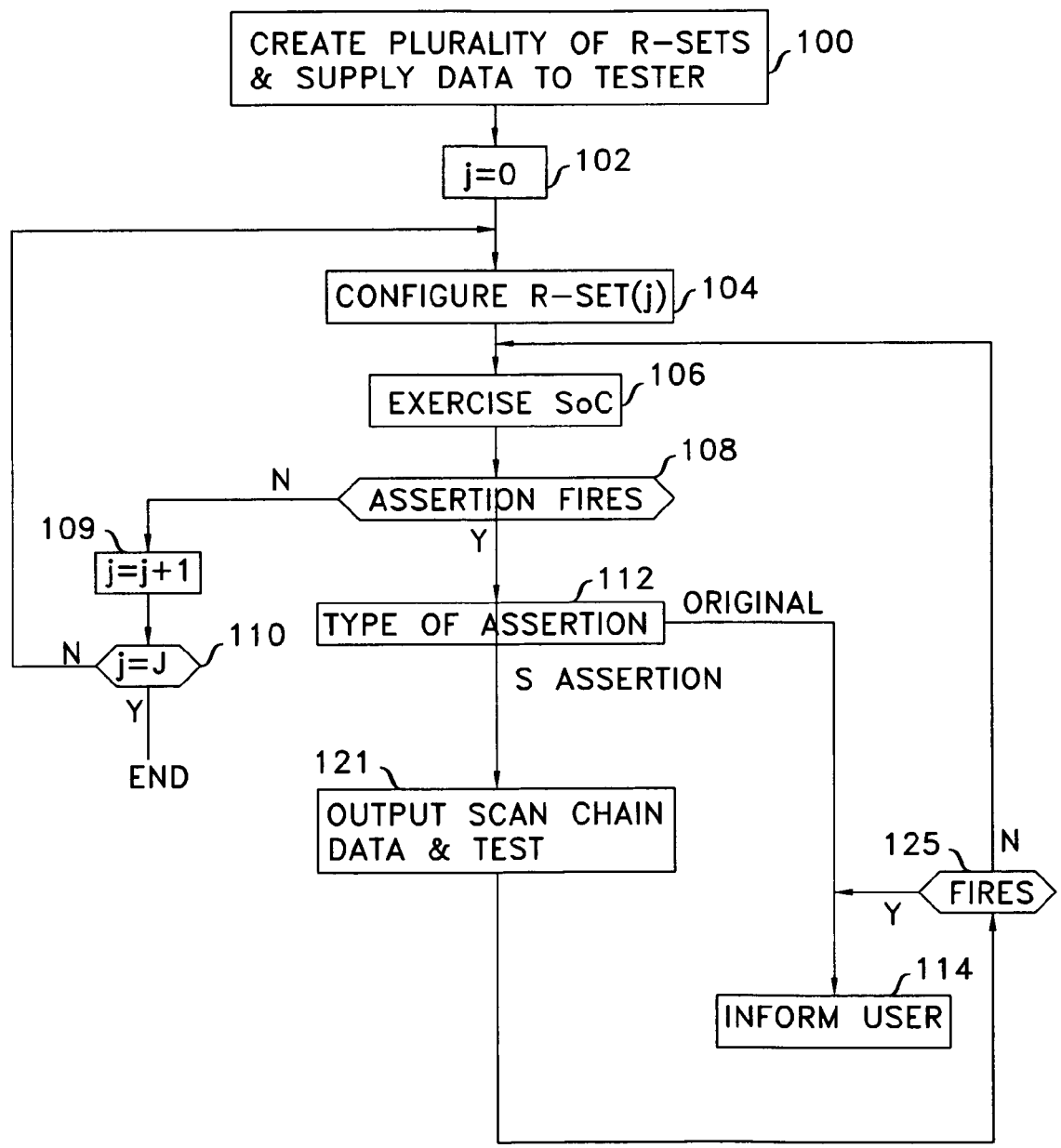
FIG. 2 presents a flowchart of a method applicable to the FIG. 1 arrangement.

FIG. 2 presents a flowchart of the method disclosed above. In step 100 a given collection of assertions is converted to an R collection, subdivided into J R-sets, and information about all S assertions is installed in tester 40. This information identifies the one or more assertions in the originally given set that each S assertion covers, and how the covered assertions are to be checked (based on the type of the S assertion).

The actual checking begins at step 102 where index j is set to 1 and control passes to step 104. In step 104 R-set(j) is configured within FRM 20, and control passes to step 106 where the exercising of the SoC is triggered and control is passed to decision block 108. In applications where the R-sets consist of assertions that employ only variables that are available with at-speed operation, the exercising is carried out at the normal operating clock frequency of the SoC. If any of the assertions that are configured within the FRM fires, decision block 108 passes control to block 112 where the signal that the firing assertion provides to controller 30 is assessed. That signal identifies the assertion.

When the assessment determines that the firing assertion is an assertion that was included in the originally given set of assertions, control passes to step 114 where controller 30 simply identifies the firing assertion to the user who is testing the SoC. Otherwise, control passes to step 121 where controller 30 causes the scan chain data to be applied to tester 40 and the data analyzed to determine whether one or more assertions of the originally given set of assertions (which the firing S assertion subsumes) fired, and applies the result of this determination to step 125. When the determination is that one or more of the assertions in the originally given set of assertions fired, control passes to step 114; otherwise, control returns to step 106.

Lastly, if step 108 determines that no assertion fired, control passes to step 109 where index j is incremented by 1 and control passes to step 110, which determines whether j=J. If not, control returns to step 104. If j=J, the process ends.

The above discloses a number of principles and approaches but it should be realized that various modifications and additions can be included that comport with the principles disclosed herein. For example, following any chosen assertion firing, controller 30 (through interaction with tester 40, or otherwise) can reconfigure the set of assertions within the FRM.

The invention claimed is:

1. A method for checking an integrated circuit that includes a core which contains a scan chain, a functionally reconfigurable module (FRM) coupled to the core, and a controller, in an arrangement that includes a tester coupled to said integrated circuit, comprising the steps of:
   (i) selecting a set of assertions with which to test said integrated circuit;
   (ii) replacing two or more of the assertions in the selected set of assertions with a subsuming assertion, to form thereby a reduced set of assertions, where a subsuming assertion (1) is characterized by a logic expression that contains fewer terms, or fewer variables, or both, than the logical union of the replaced assertions, and (2) assumes a given logic level whenever the logical union of the replaced assertions assumes said given logic level;
   (iii) configuring the reduced set of assertions in said FRM;
   (iv) applying a signal to said integrated circuit;
   (v) when said FRM indicates that one of the configured assertions fired, indicating that the assertion failed to yield an expected result,
      (a) determining whether the fired assertion is said subsuming assertion;
      (b) if said step of determining concludes that said fired assertion is said subsuming assertion, applying signals that cause said scan chain to provide data to said tester; and
      (c) analyzing said signals in said tester to determine whether any one of the replaced assertions also fires.

2. The method of claim 1 further comprising the step of outputting an alert signal when step (v)(a) indicates that the fired assertion is a subsuming assertion, only when step (v)(c) also indicates that one of said replaced assertions fires.

3. The method of claim 1 further comprising the step of selecting another set of assertions with which to test said integrated circuit, and repeating steps (i) through (v).

4. The method of claim 1, where step (ii) creates more than one subsuming assertion, each of which replaces two of more assertions in said selected set.

5. The method of claim 1 where said step of applying a signal applies an operational clock.

6. The method of claim 5 where said step of applying a signal comprises:
   applying a signal to stop applying said clock; and
   applying a signal to output data from said scan chain.

7. The method of claim 1 wherein said set of assertions configured within the FRM is constrained to assertions that require only signals that are observable with at-speed operation.

8. The method of claim 1 where said step (v)(c) is performed in software.

9. The method of claim 1 where the assertions configured within the FRM comprise both combinatorial and sequential circuits.

10. A method for assertion checking of an integrated circuit comprising:

modifying a given set of assertions by replacing one or more of the given assertions with a subsuming assertion that covers the replaced assertions and also requires less logic to implement, thereby forming a modified set of assertions, where a subsuming assertion (1) is characterized by a logic expression that contains fewer terms, or fewer variables, or both, than the logical union of the replaced assertions, and (2) assumes a given logic level whenever the logical union of the replaced assertions assumes said given logic level;

configuring at least a subset of the modified set of assertions in functionally reconfigurable circuitry within said integrated circuit, which subset includes said subsuming assertion;

checking assertions configured in said functionally reconfigurable circuitry; and when said subsuming assertion fires to indicate that the subsuming assertion fails to result in an expected value, checking with an auxiliary tester the assertions that the subsuming assertion replaced to determine which, if any, of the replaced assertions fired.

11. A method for checking an integrated circuit that includes a core which contains a scan chain, a functionally reconfigurable module (FRM) coupled to the core and a controller, and a tester coupled to said integrated circuit, comprising the steps of:

replacing an one or more assertions of a given set of assertions by a subsuming assertion that covers more than the replaced one or more assertions and requires less logic to implement than the replaced one or more assertions, thereby creating a modified set of assertions, where a subsuming assertion (1) is characterized by a logic expression that contains fewer terms, or fewer variables, or both, than the logical union of the replaced assertions, and (2) assumes a given logic level whenever the logical union of the replaced assertions assumes said given logic level;

checking the modified set of assertions in hardware, and when said step of checking indicates that said subsuming assertion fires, checking the fired subsuming assertion with aid of a tester outside said integrated circuit that is coupled to said integrated scan chain.

12. The method of claim 11 where checking the modified set of assertions in hardware is effected by configuring said modified set of assertions by configuring said FRM to implement said modified set of assertions.

13. The method of claim 12 where said given set of assertions from which said modified set of assertions is created is a subset of a collection of assertions against which said integrated circuit is checked.

14. The method of claim 11 where said tester outside said integrated circuit checks said fired subsuming assertion using a software module.

* * * * *